(12) United States Patent
Tee et al.

(10) Patent No.: US 9,664,737 B2
(45) Date of Patent: May 30, 2017

(54) METHOD FOR PROVIDING AN ON-CHIP VARIATION DETERMINATION AND INTEGRATED CIRCUIT UTILIZING THE SAME

(71) Applicant: MediaTek Inc., Hsin-Chu (TW)

(72) Inventors: Kok-Tiong Tee, Hsin-Chu (TW); Heng-Meng Liu, Jhubei (TW); Yipin Wu, Singapore (SG)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/812,219

(22) Filed: Jul. 29, 2015

(65) Prior Publication Data

US 2016/0054387 A1 Feb. 25, 2016

Related U.S. Application Data

(60) Provisional application No. 62/066,949, filed on Oct. 22, 2014, provisional application No. 62/038,934, filed on Aug. 19, 2014.

(51) Int. Cl.
*G01R 31/28* (2006.01)
*G01R 31/317* (2006.01)
*G01R 31/30* (2006.01)

(52) U.S. Cl.
CPC ... *G01R 31/31725* (2013.01); *G01R 31/3016* (2013.01)

(58) Field of Classification Search
CPC .............. G01R 31/31725; G01R 31/3016
See application file for complete search history.

(56) References Cited

U.S. PATENT DOCUMENTS

| | | | |
|---|---|---|---|
| 2007/0214377 A1* | 9/2007 | Jarrar .................. | G06F 1/10 713/401 |
| 2008/0046848 A1* | 2/2008 | Tetelbaum .......... | G06F 17/5031 716/113 |
| 2013/0241690 A1* | 9/2013 | Wallace ............... | G05B 1/01 340/3.1 |
| 2014/0189457 A1* | 7/2014 | Mak ................. | G01R 31/31716 714/745 |
| 2016/0085895 A1* | 3/2016 | Hathaway ........... | G06F 17/5031 716/136 |

* cited by examiner

*Primary Examiner* — April Y Blair
*Assistant Examiner* — Thien D Nguyen
(74) *Attorney, Agent, or Firm* — McClure, Qualey & Rodack, LLP (57) ABSTRACT

A method for providing an on-chip variation determination and an integrated circuit utilizing the same are provided. The method includes: outputting, by a launch register circuit, a test data to the capture register circuit according to the first clock; receiving, by a capture register circuit, the test data from the launch register circuit according to the second clock; adjusting, by a control circuit, a first number of a first chain of delay elements to generate the first clock and a second number of a second chain of delay elements for the capture register circuit to just capture the test data to generate the second clock; and determining, by the control circuit, a path delay between the launch register circuit and the capture register circuit based on the first number of the first chain of delay elements and the second number of the second chain of delay elements.

10 Claims, 7 Drawing Sheets

METHOD FOR PROVIDING AN ON-CHIP VARIATION DETERMINATION AND INTEGRATED CIRCUIT UTILIZING THE SAME

CROSS REFERENCE TO RELATED APPLICATIONS

This application claims priority of U.S. Provisional Application No. 62/038,934, filed on Aug. 19, 2014, and U.S. Provisional Application No. 62/066,949, filed on Oct. 22, 2014, the entirety of which is incorporated by reference herein.

BACKGROUND OF THE INVENTION

Field of the Invention

The present invention relates to integrated circuits and in particular to a method for providing an on-chip variation determination and an integrated circuit utilizing the same.

Description of the Related Art

Electronic design automation (EDA) tools are widely adopted in Integrated Circuit (IC, also referred to as a chip) design and layout for simulating the timing of the circuits and determining cell placement. EDA tools are operated on a computer without the needs of IC fabrication. One such EDA tool can perform Static Timing Analysis (STA), which computes the expected timing of digital circuits on an IC without requiring simulation.

STA is performed with reasonable accurate models of devices and cells under various sets of expected variations, referred to as different "corners". Process, Voltage, Temperature (PVT) corners are based on assumptions regarding process, operating voltage, and operating temperature variations in device operation from one IC to another. The circuits are required to pass all timing requirements under various PVT conditions in STA before getting a timing signoff and proceeding to be manufactured.

As the semiconductor technology continues scaling down, the impact of on-chip variation deviating from STA becomes significant. Therefore, v a method providing an on-chip variation determination and an integrated circuit utilizing the same are disclosed for an On-chip Variation (OCV) determination, which determine the intrinsic variation of semiconductor processes and their impact on STA.

BRIEF SUMMARY OF THE INVENTION

The disclosure provides an application for the touch connection which allows a user to use a mobile device to request service information on demand from service equipment via a touch connection, and the service equipment can generate service information based on the user demand, and respond with the service information to the mobile device, thereby providing a safer and more convenient data transfer.

A detailed description is given in the following embodiments with reference to the accompanying drawings.

An embodiment of an integrated circuit is described, including a delay determination circuit and a control circuit. The delay determination circuit includes a launch register circuit, a capture register circuit, and first and second chain of delay elements. The launch register circuit is configured to output a test data according to a first clock. The capture register circuit, coupled to the launch register circuit, is configured to capture the test data according to a second clock. The first chain of delay elements, coupled to the launch register circuit, is configured to receive a source clock to generate the first clock, wherein a first number of the first chain of delay elements is adjustable to provide the first clock to the launch register circuit. The second chain of delay elements, coupled to the capture register circuit, is configured to receive the source clock to generate the second clock, wherein a second number of the second chain of delay elements is adjustable to provide the second clock to the capture register circuit. The control circuit, coupled to the delay determination circuit, is configured to adjust the first number of the first chain of delay elements and the second number of the second chain of delay elements for the capture register circuit to just capture the test data, and determine a path delay between the launch register circuit and the capture register circuit based on the first number of the first chain of delay elements and the second number of the second chain of delay elements.

An embodiment of a method of providing an on-chip variation determination to an integrated circuit is described, including: outputting, by a launch register circuit, a test data to the capture register circuit according to the first clock; receiving, by a capture register circuit, the test data from the launch register circuit according to the second clock; adjusting, by a control circuit, a first number of a first chain of delay elements and a second number of a second chain of delay elements for the capture register circuit to just capture the test data; wherein the first number of the first chain of delay elements is configured to receive a source clock to generate the first clock, and the second number of the second chain of delay elements is configured to receive the source clock to generate the second clock; and determining, by the control circuit, a path delay between the launch register circuit and the capture register circuit based on the first number of the first chain of delay elements and the second number of the second chain of delay elements.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
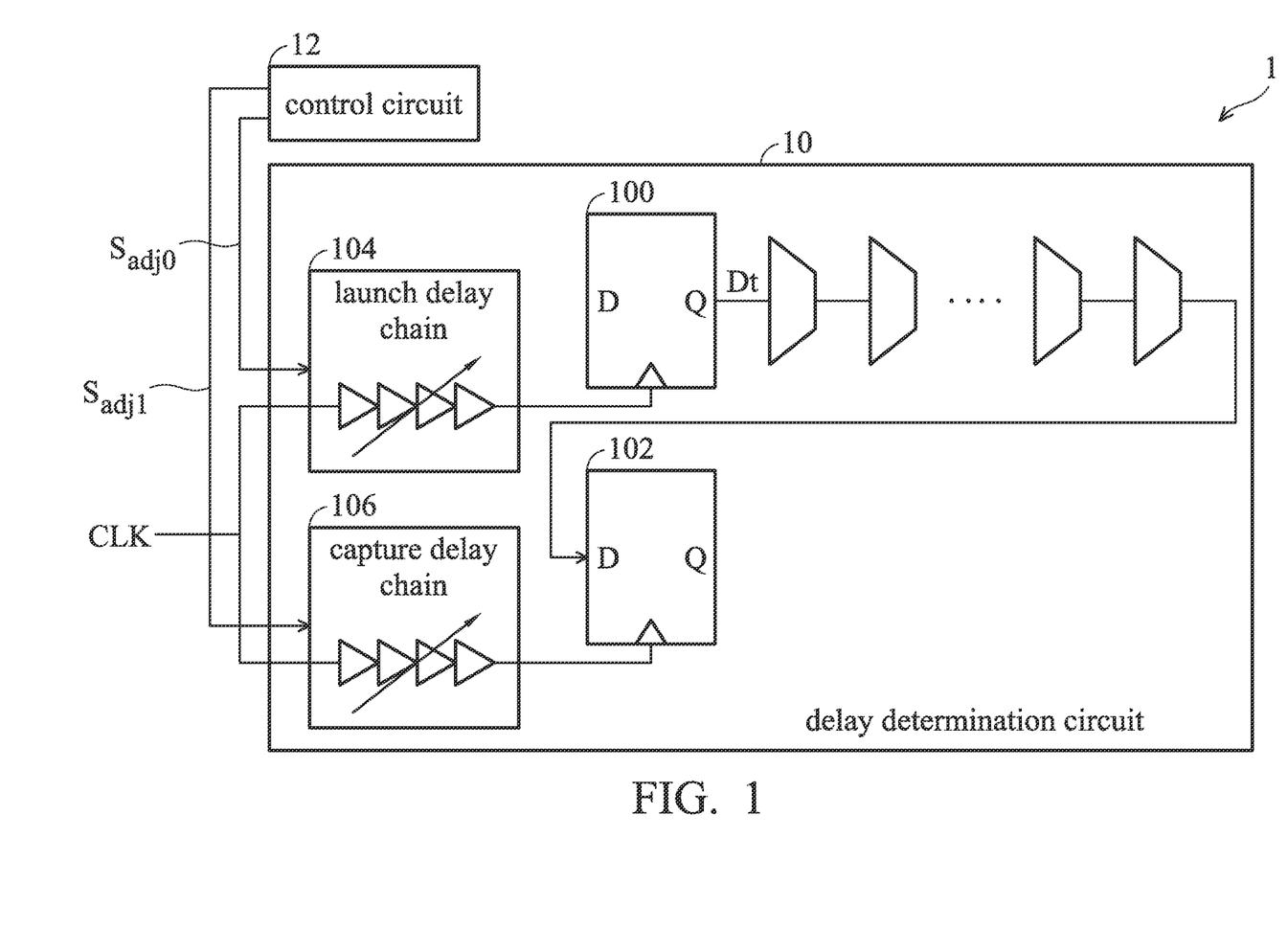
FIG. 1 is a block diagram of a variation detector 1 according to an embodiment of the invention.

Described herein are various embodiments of a circuit and method for evaluating the intrinsic timing variation FIG. 1 is a block diagram of a variation detector 1 according to an embodiment of the invention, including a delay determination circuit 10 and a control circuit 12. The variation detector 1 may be implemented on an integrated circuit to identify a timing variation of a path delay, which may be in agreement with or different from a delay model used in a static timing analysis (STA). The delay determination circuit 10 further contains a launch register 100 (launch register circuit), a capture register 102 (capture register circuit), a launch delay chain 104 (first chain of delay elements) and a capture delay chain 106 (second chain of delay elements), and a combination logic circuit lumped between the launch register 100 and the capture register 102. In the example, the combination logic circuit includes a number of multiplexers connected in series.

The launch delay chain 104 and the capture delay chain 106 each contains four delay elements connected in series, and the number of the active delay elements is adjustable to provide a desired clock delay. In other words, the clock delay is controlled by activating and/or deactivating a selected number of the delay elements in the delay chain. For example, the launch delay chain 104 may be configured to operate with only three out of the four delay elements. After the launch delay chain 104 receives a clock CLK from a clock generator (not shown), the clock CLK will propagate through the three selected delay element to provide a launch clock (first clock) to the launch register 100. Likewise, the capture delay chain 106 may be configured to operate with all four delay elements. After the capture delay chain 106 receives the clock CLK from the same clock generator, the clock CLK will propagate through the four selected delay elements to provide a capture clock (second clock) to the capture register 102. The clock generator may be a crystal oscillator, a ring oscillator, or a resonant circuit. The delay element in the launch delay chain 104 and the capture delay chain 106 may be an inverter, a buffer, or a delay gate.

The launch register 100 may output a test data Dt when the launch clock arrives. The test data Dt may be pre-stored in a local memory (not shown) and loaded into the launch register 100 upon initialization. The launched test data Dt may take a finite propagation time to move across all the multiplexers to reach the capture register 102. The propagation time is known as a path delay between the launch register 100 and the capture register 102. The test data Dt may be latched in the capture register 102 upon receiving the capture clock.

The path delay between the launch register 100 and the capture register 102 can be measured by adjusting the numbers of the delay elements in the launch delay chain 104 and/or the capture delay chain 106, which define clock skews of the launch clock and the capture clock, respectively. Specifically, initially, a first number of the delay elements in the launch delay chain 104 and/or a second number of the delay elements of the capture delay chain 106 are adjusted such that a clock skew between the launch clock and capture clock increases and the capture register 102 is no longer able to latch the test data Dt. Next, the clock skew between the launch clock and capture clock can be gradually decreased by either increasing the first number of the delay elements in the launch delay chain 104 or decreasing the second number of the delay elements of the capture delay chain 106. The clock skew between the launch clock and capture clock continues to be shrunk until, eventually, the capture register 102 can just receive the test data Dt with the capture clock. The clock skew at this point is the path delay between the launch register 100 and the capture register 102. The first number of the delay elements in the launch delay chain 104 and the second number of the delay elements of the capture delay chain 106 may be recorded in a local memory (not shown) such as a register, or output to the control circuit 12 or an electronic equipment connected to the IC.

The adjustment of the first number of the delay elements in the launch delay chain 104 and the second number of the delay elements of the capture delay chain 106 is provided by the control circuit 12. The output of the capture register 102 can be fed back to the control circuit 12, which in turn adjusts the first number of the delay elements in the launch delay chain 104 and the second number of the delay elements of the capture delay chain 106 according to the output of the capture register 102. For example, the control circuit 12 may increase one more delay element in the launch delay chain 104 or decrease one less delay element of the capture delay chain 106 when the capture register 102 fails to catch the test data Dt, and stop making adjustment to the numbers of the delay elements in the launch delay chain 104 and the capture delay chain 106 when the test data Dt is correctly latched by the capture register 102.

Figure 2:
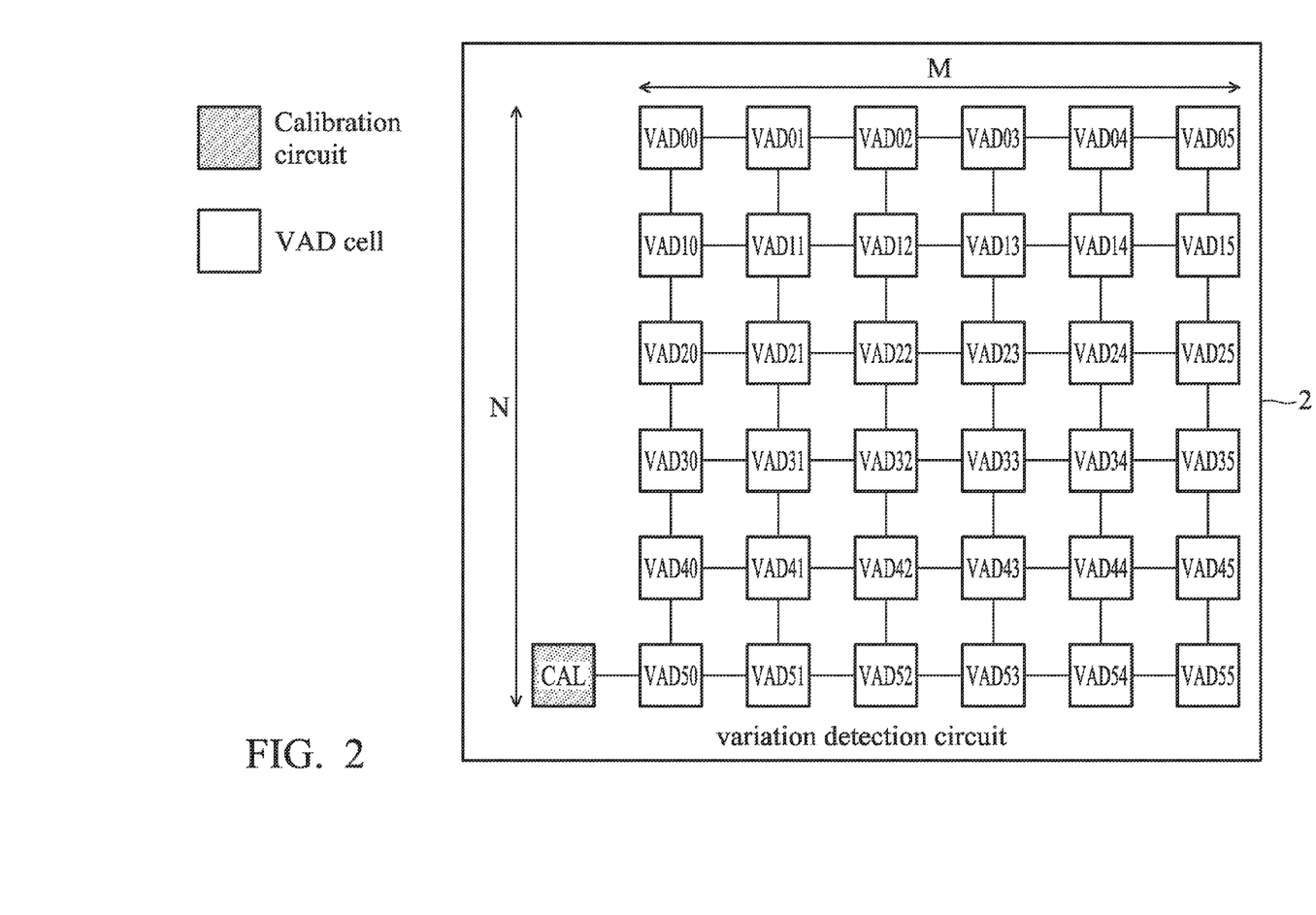
FIG. 2 is a block diagram of a variation detection circuit 2 according to an embodiment of the invention.

FIG. 2 is a block diagram of a variation detection circuit 2 according to an embodiment of the invention, including a plurality of variation monitoring cells VAD00 through VAD55 and a calibration circuit CAL. The plurality of variation monitoring cells VAD00 through VAD55 are arranged in an M by N matrix, where M and N are integers and in this embodiment, M and N are both 6. Each delay monitoring cell VAD00 through VAD55 is connected to adjacent delay monitoring cells and comprises the delay determination circuit. The variation detection circuit 2 is fabricated on an IC, serving to measure device and wire delay variations deviating from the models used in the STA.

Each variation monitoring cell VAD00 through VAD55 is identical to one another and may contain a circuit configuration provided by the delay determination circuit 10 in FIG. 1, and may be configured to measure a path delay and route a test data to one or more interconnected delay monitoring cells. For example, the variation monitoring cell VAD00 may be configured to route a test data to the variation monitoring cell VAD01 or the variation monitoring cell VAD10, and the variation monitoring cells VAD00 and VAD01 or VAD10 may be configured to measure a path delay therebetween by the method outline in FIG. 1. An exemplary circuit arrangement for the variation monitoring cell VAD is provided in FIG. 4.

In addition, the variation monitoring cells VAD00 through VAD55 may be configured and controlled by a control circuit such as the control circuit 12 in FIG. 1, to set up a traveling route for the test data and measure a path delay between start and destination VADs of the traveling route. In particular, a route which is originated at a start VAD, linked by intermediate VADs, and ended at a destination VAD may be configured by the control circuit 12. The test data may propagate along the configured route while a path delay between the start VAD and destination VAD may also be measured and determined by the control circuit according to the procedure described in FIG. 1.

The calibration circuit CAL may determine the delay time of the delay element in the delay chains in each variation monitoring cell VAD. Details for the delay element calibration are provided in FIG. 5.

The control circuit 12 may control the operations of the variation monitoring cells VAD and the calibration circuit CAL. Specifically, during a factory test, the control circuit 12 may activate the calibration circuit CAL to determine the delay time of the delay element in the delay chains, and then configure a route in the plurality of variation monitoring cells VAD00 through VAD55. A test data is output from the start VAD of the route, then travels along the intermediate VADs and wires, and stops at the destination VAD. In some embodiments, the control circuit 12 may measure and determine the path delay for the configured route by keeping on adjusting the first number of the delay elements in the launch delay chain in the start VAD and the second number of the delay elements in the capture delay chain in the destination VAD until the destination VAD just captures the test data, obtaining the clock skew of the launch and capture clocks in terms of delay element difference between the launch and capture delay chains, and converting the delay element difference into a unit of time. The delay element difference may be converted into time because the delay time for each delay element is known from the calibration circuit CAL during a delay calibration procedure.

The route may be configured based on predefined route paths stored in local memory (not shown) of the IC and automatically loaded by the control circuit 12 upon initialization of the variation test procedure, or entered by a test personnel through a hardware interface such as a computer or testing equipment connecting to the control circuit 12. The control circuit 12 may record the determined path delay along with each configured route in the local memory, or output the determined path delay and each configured route to the connected computer or testing equipment for further variation correlation and analysis for various Process, Voltage and Temperature (PVT) conditions and intra-die spatial variations.

The variation detector 1 and the variation detection circuit 2 determine path delays between a launch register and a capture register for a fixed route or a user-defined route, which may be used for the on-chip variation correlation and determination.

Figure 3:
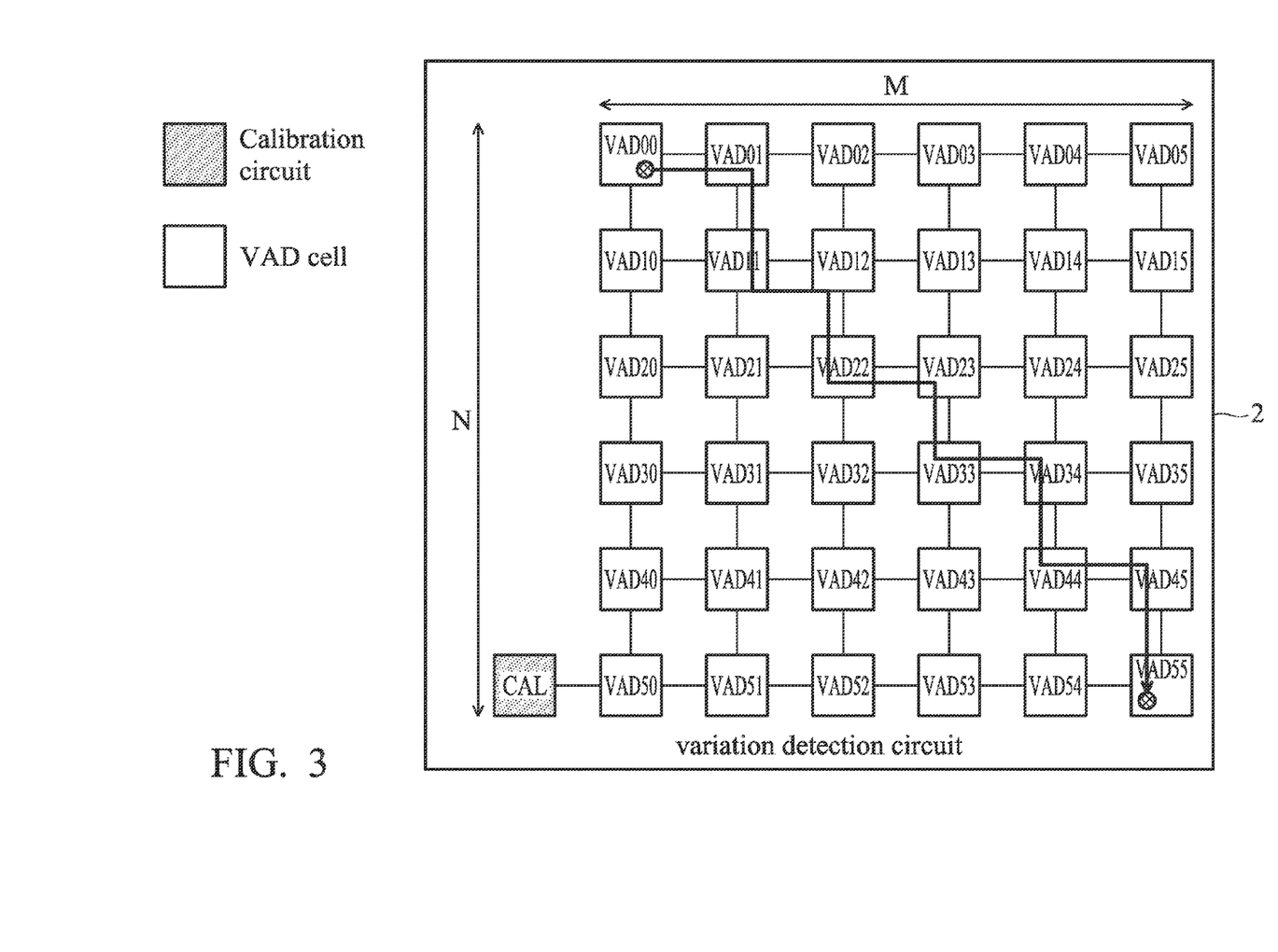
FIG. 3 is a schematic diagram illustrating operations of the variation detection circuit 2 according to an embodiment of the invention.

FIG. 3 shows an example illustrating operations of the variation detection circuit 2 according to an embodiment of the invention. As shown in FIG. 3, a route originating at the VAD cell VAD00, connecting by the VAD cells VAD 11, VAD22, VAD33, VAD44, and terminating at the VAD cell VAD 55 is defined by the control circuit 12.

Starting from a large clock skew between the launch and capture clocks, which causes the VAD cell VAD 55 is unable to capture the test data originated from the VAD cell VAD00, the control circuit 12 may then adjust the first number of the delay cells in the launch delay chain in the VAD cell VAD00 and the second number of the delay cells in the capture delay chain in the VAD cell VAD55 for the VAD cell VAD55 to just capture the test data. The control circuit 12 may determine the path delay of the route based on the clock skew which allows the VAD cell VAD55 to just capture the test data. The control circuit 12 may determine the delay path. In some embodiments, because the number of the delay cells in the launch delay chain and the capture delay chain is limited and may be insufficient for estimating the path delay of a long route path. In cases as such, the clock input into the capture may be delayed for a known period of time Td, and later, the path delay may be computed by taking the clock delay period Td into consideration. For example, the clock input into the launch delay chain may has no delay while the clock input into the capture delay chain may be delayed for 1 ms. The control circuit 12 may proceeds to find the path delay between the VAD cells VAD00 and VAD55 by adding the clock delay period Td to the clock skew which allows the VAD cell VAD55 to just capture the test data. The clock delay period Td delayed may be implemented by register circuits or a delay chain.

Figure 4:
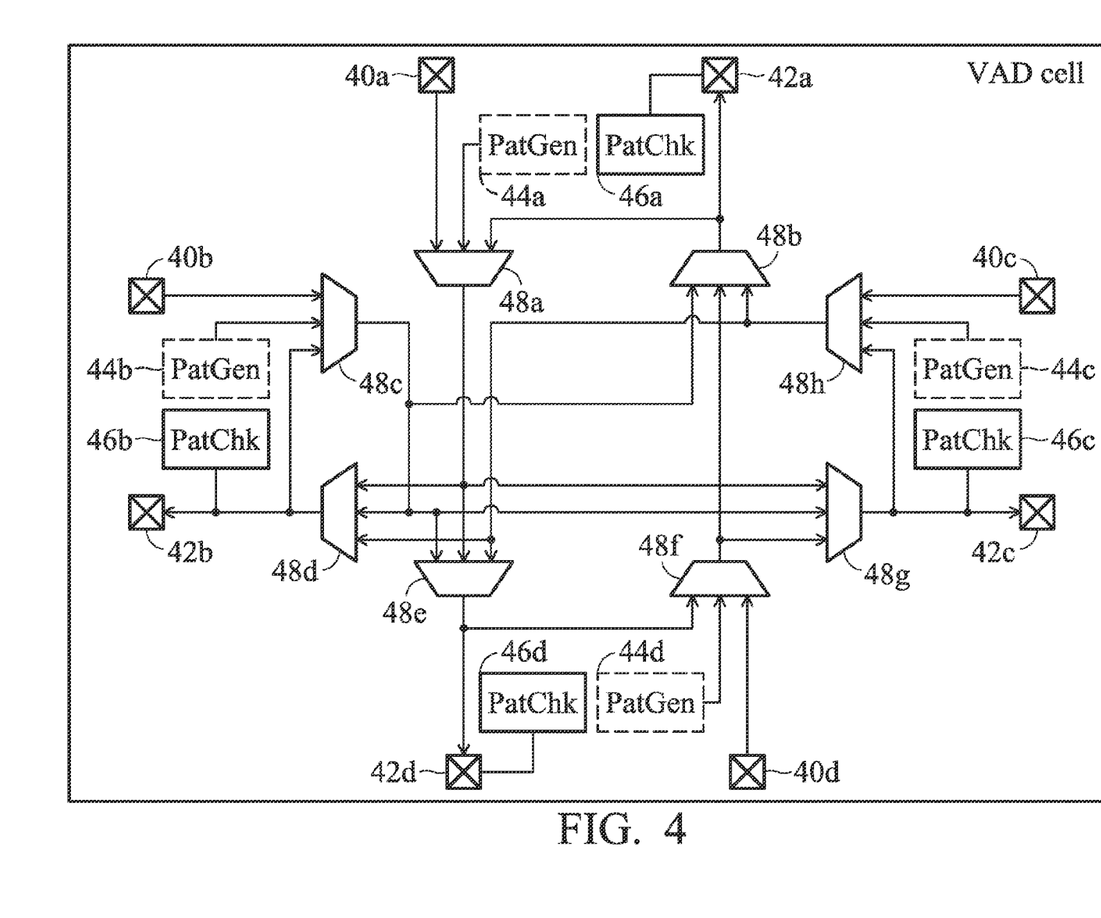
FIG. 4 is a block diagram of a variation detection cell 4 according to an embodiment of the invention.

FIG. 4 is a block diagram of a variation detection cell 4 according to an embodiment of the invention, including input ports 40a through 40d, output ports 42a through 42d, one or more pattern generation circuits PatGen 44a through 44d, pattern check circuits PatChk 46a through 46d, and route multiplexers 48a through 48h. Only one of the pattern generation circuits PatGen 44a through 44d is required in each VAD cell 4. The VAD cell 4 may be incorporated into the variation detection circuit 2 in FIG. 2 to form the variation determination matrix. Accordingly, the VAD cell 4 may be configured to route a test data to a neighboring VAD cell and measure a path delay. Furthermore, the VAD cell 4 may be configured and control by a control circuit such as the control circuit 12 in FIG. 1.

The pattern generation circuits PatGen 44a, b, c, or d may be configured to generate the test data, which may be loaded from a local memory (not shown), or is hard-wired on the pattern generation circuits PatGen 44a, b, c, or d. The pattern check circuits PatChk 46a through 46d may be configured to determine accuracy of the received test data. When the received test data is accurate, the pattern check circuit PatChk 46 a, b, c, or d may output a validation signal indicating that an accurate test data has been identified; whereas when the received test data is inaccurate, the pattern check circuit PatChk a, b, c, or d may output a validation signal indicating that an inaccurate test data has been identified. The validation signal may be sent to the control circuit 12 for determine whether the pattern check circuit PatChk a, b, c, or d has latched the test data accurately.

The pattern generation circuits PatGen 44a, b, c, or d may be implemented by one or more registers which may receive the test data from the local memory or are hard-wired to a fixed test data. The pattern check circuits PatChk 46a through 46d may include a comparator circuit which compares the received test data against a reference test data. The pattern check circuits PatChk 46a through 46d may also include one or more registers which may receive the test data from the local memory or are hard-wired to a fixed test data.

The VAD cell 4 may further include first and capture delay chains (not shown), with the launch delay chain outputting a launch clock to the pattern generator circuit PatGen a, b, c, or d, and the capture delay chain outputting a capture clock to the pattern check circuits PatChk 46a, b, c, and d. The first and capture delay chains contain a plurality of delay elements and operate as described in FIG. 1. The control circuit 12 may adjust the numbers of the delay elements in the first and capture delay chains to determine the path delay of the configured route according to the variation detection procedure.

The route multiplexers 48a through 48h may be configured to set up a route for the test data. The input ports 40a through 40d may receive the test data from a neighboring VAD cell, and the output ports 42a through 42d may transmit the test data to a neighboring VAD cell. Each route multiplexer 48a through 48h includes 3 inputs, 1 output, and a selection pin which can be configured by the control circuit 12 to select one from the 3 inputs to serve as the output. The control circuit 12 may configure the route multiplexers 48a through 48h to set up the route. For instance, when configuring a route from an up-VAD cell to a right-VAD cell, the route multiplexer 48a may be configured to link the path from the input port 40a to the output of the route multiplexer 48a and the route multiplexer 48g may be configured to select the path from the wire interconnection with the route multiplexer 48a to the output port 42c, thereby forming a route path from the up-VAD cell to the right-VAD cell.

Figure 5:
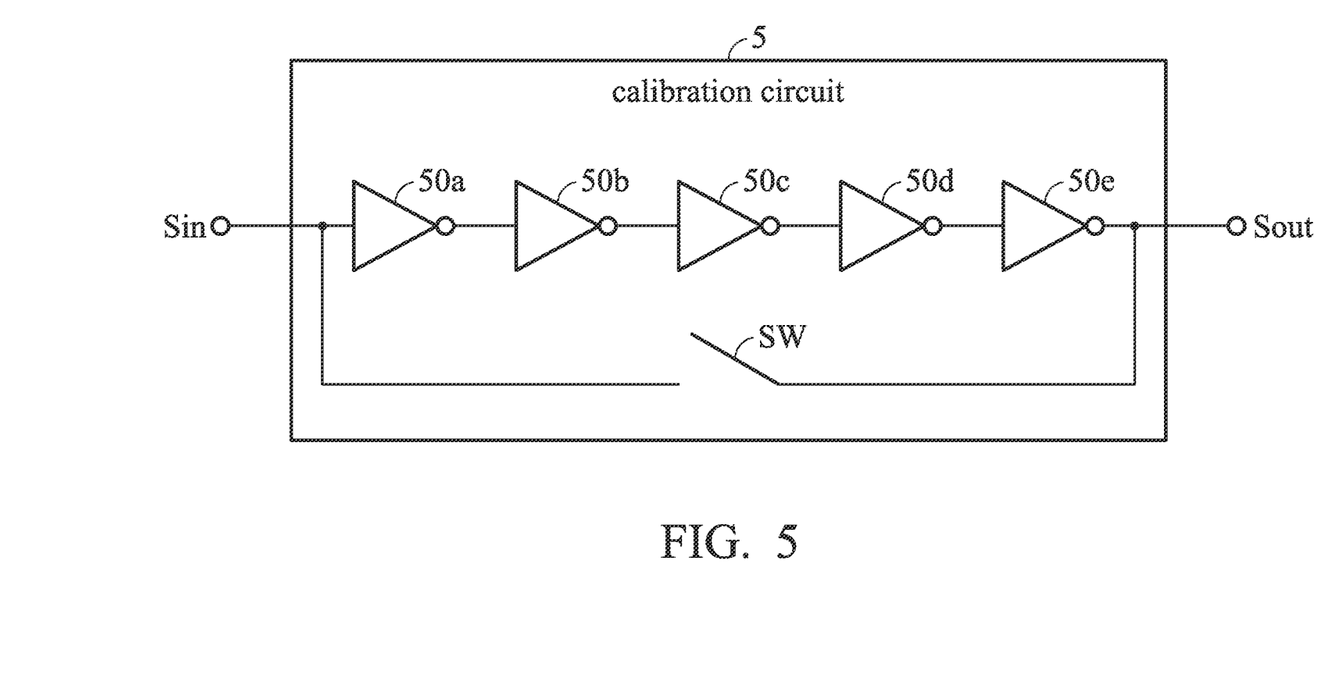
FIG. 5 is a block diagram of a calibration circuit 5 according to an embodiment of the invention.

FIG. 5 is a block diagram of a calibration circuit 5 according to an embodiment of the invention, including an odd number of inverters 50a through 50e and a switch SW connected in a ring form. The inverter in the calibration circuit 5 may form the delay element in the launch and capture delay chains of the VAD cells in FIG. 2, and those skilled in the art will recognize that delay cells may be used in place of the inverters to act as a delay line oscillator. The inverters 50a through 50e may operate as a ring oscillator by closing the switch SW. When a pulse signal Sin is inject into the ring oscillator, the pulse signal will change the polarity alternately at each successive inverter output and form an oscillation signal Sout. The delay time of the delay element in the in the launch and capture delay chains of the VAD cells in FIG. 2 may be estimated by measuring the period of the oscillation signal Sout or inverting the frequency of the oscillation signal Sout. The control circuit 12 may use the delay time of the delay element to estimate the path delay of a configured route in the variation detection circuit 2.

Figure 6:
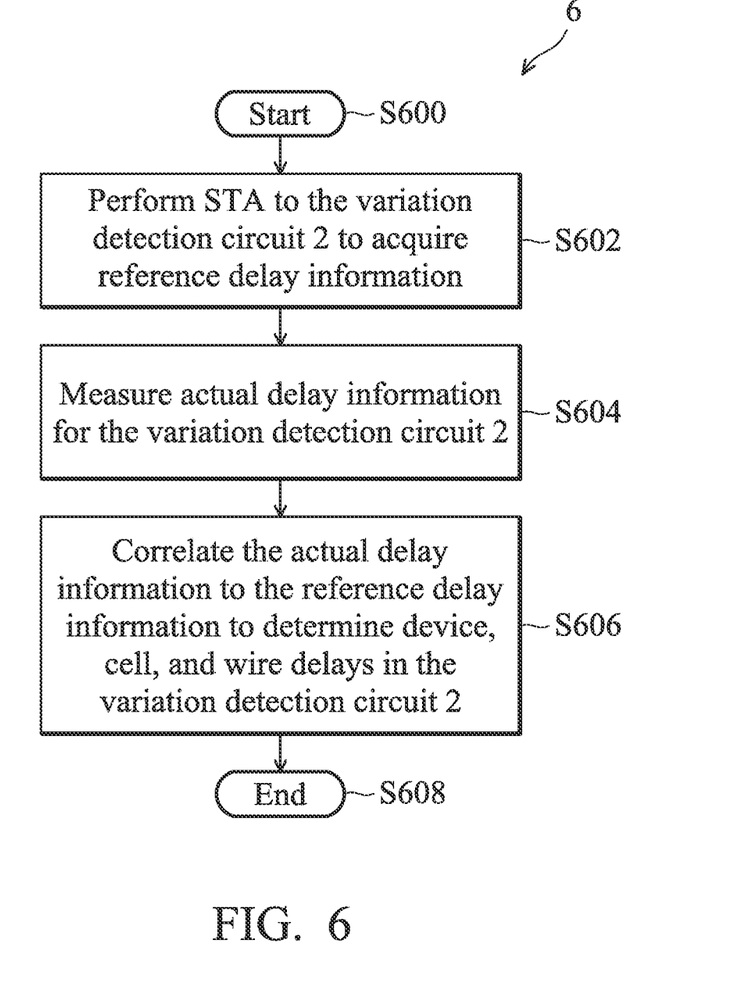
FIG. 6 is a flowchart of an on-chip variation detection method 6 according to an embodiment of the invention.

FIG. 6 is a flowchart of an on-chip variation detection method 6 according to an embodiment of the invention, incorporating the variation detection circuit 2 in FIG. 2. The on-chip variation detection method 6 is adopted in an IC simulation and test procedure to correlate on-chip variation characteristics with STA models under various PVT conditions and intra-die spatial variations.

Upon startup, a STA procedure may be applied to all circuits and components on an IC, including the variation detection circuit 2, during an IC design cycle to acquire a timing report of the IC (S602). The timing report contains reference delay information of paths in the variation detection circuit 2, as well as all other routing paths on the IC.

After the IC is fabricated, a factory test may be conducted to the circuits of each IC, under various PVT conditions and intra-die spatial variations. More specifically, the actual delay information of the variation detection circuit 2 can be detected and measured by a control circuit by an on-chip variation measurement method 7 explained in FIG. 7 (S604). The actual delay information includes the configured routes and the corresponding path delays. The actual delay information of the variation detection circuit 2 may be output to a computer or testing equipment connected to the IC under the test.

The computer or testing equipment can subsequently correlate the actual delay information to the reference delay information to determine device, cell, and wire delays in the variation detection circuit 2 (S606), thereby establishing a relationship between the STA models and actual measurements for the devices, cells, and wires on the IC. Later, the STA model may be updated based on the correlation to provide an increased accuracy of timing estimation during the design phase.

The on-chip variation detection method 6 is then terminated and exited (S608).

Figure 7:
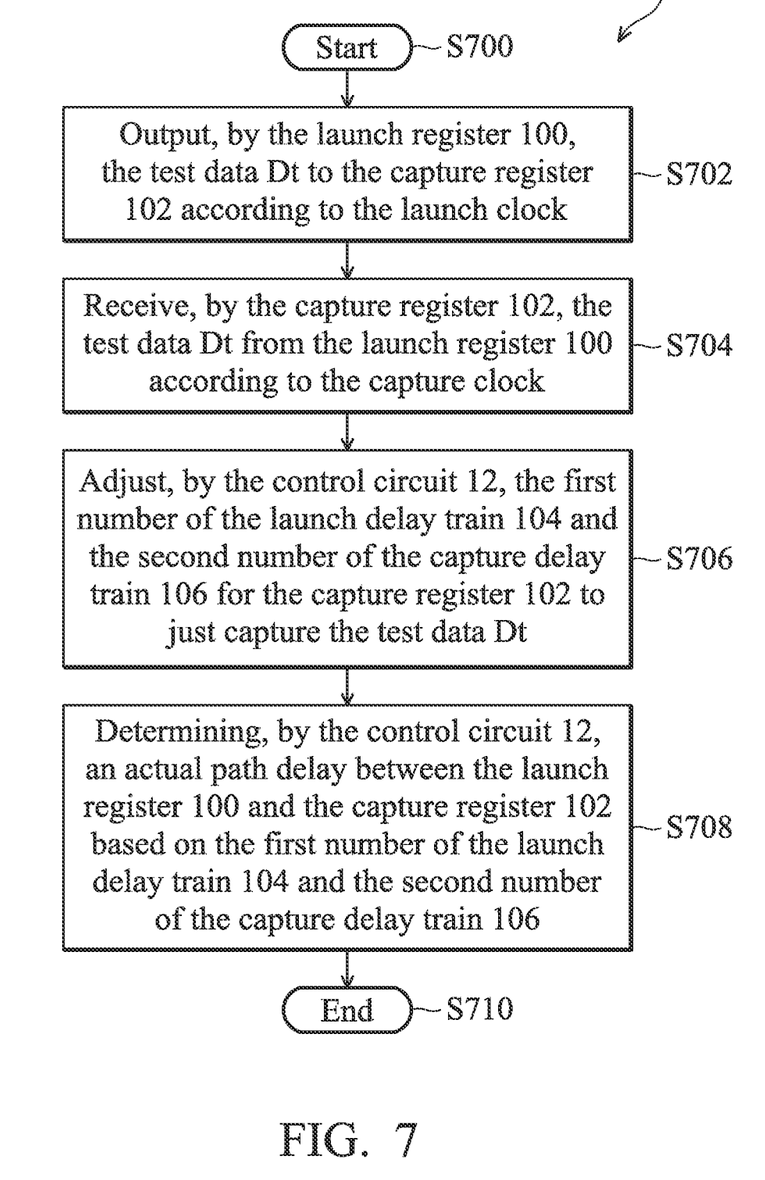
FIG. 7 is a flowchart of an on-chip variation measurement method 7 according to an embodiment of the invention.

FIG. 7 is a flowchart of an on-chip variation measurement method 7 according to an embodiment of the invention, incorporating the variation detector 1 in FIG. 1 or the variation detection circuit 2 in FIG. 2. The on-chip variation detection method 7 is adopted to determine path delays for a fixed or user-configured route. The embodiment uses the variation detector 1 to illustrate each step of the on-chip variation measurement method 7.

Upon startup, the test data Dt is output by the launch register 100 to the capture register 102 according to the launch clock (S702). Accordingly, the launch clock is supplied by the launch delay chain 104, which contains the plurality of delay elements, with the first number of the delay elements in the launch delay chain 104 being adjustable by the control circuit 12.

The test data Dt propagates across the intermediate circuits and is then received by the capture register 102 according to the capture clock (S704). The capture clock is supplied by the capture delay chain 106, which also contains the plurality of delay elements, with the second number of the delay elements in the capture delay chain 106 being adjustable by the control circuit 12. Once the on-chip variation measurement method 7 is initiated, the control circuit 12 is configured to adjust the first number of the delay elements in the launch delay chain 104 and the second number of the delay elements in the capture delay chain 106 to increase the clock skew between the launch clock and the capture clock such that the capture register 102 is unable to latch the test data Dt.

Then the control circuit 12 is configured to adjust the first number of the launch delay train 104 and the second number of the capture delay train 106 for the capture register 102 to just capture the test data Dt (S706). At this point, the clock skew between the launch clock and the capture clock may be converted as the actual delay path between the launch register 100 and the capture register 102. Therefore the control circuit 12 is configured to determine actual path delay between the launch register 100 and the capture register 102 based on the first number of the launch delay train 104 and the second number of the capture delay train 106 (S708). Specifically, the control circuit 12 is configured to determine a delay-element difference of the first number of the launch delay chain 104 and the second number of the capture delay chain 106, convert the delay-element difference into time as the path delay, and output the path delay to a connected computer or testing equipment for correlating to the STA models. In certain embodiments, when the circuit route between the launch register 100 and the capture register 102 is user-configurable, the control circuit 12 may be further configured to output the user-configured route along with the path delay to the connected computer or testing equipment.

The on-chip variation detection method 7 is then terminated and exited (S710).

The on-chip variation detection methods 6 and 7 determine path delays between a launch register and a capture register for a fixed route or a user-defined route, which can be used in the on-chip variation correlation and determination.

It should be noted that although not explicitly specified, one or more steps of the methods described herein can include a storing, displaying and/or outputting step as required for a particular application. In other words, any data, records, fields, and/or intermediate results discussed in the methods can be stored, displayed, and/or outputted to another device as required for a particular application. While the foregoing is directed to embodiments of the present invention, other and further embodiments of the invention can be devised without departing from the basic scope thereof. Various embodiments presented herein, or portions thereof, can be combined to create further embodiments. The above description is of the best-contemplated mode of carrying out the invention. This description is made for the purpose of illustrating the general principles of the invention and should not be taken in a limiting sense. The scope of the invention is best determined by reference to the appended claims.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or another programmable logic device, discrete gate or transistor logic, discrete hardware components or any combination thereof designed to perform the functions described herein. A general purpose processor may be a microprocessor, but in the alternative, the processor may be any commercially available processor, controller, micro controller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, comprising:
   a delay determination circuit, comprising:
   a launch register circuit, configured to output a test data according to a first clock;
   a capture register circuit, coupled to the launch register circuit, configured to capture the test data according to a second clock;
   a first chain of delay elements, coupled to the launch register circuit, configured to receive a source clock to generate the first clock, wherein a first number of the first chain of delay elements is adjustable to provide the first clock to the launch register circuit; and
   a second chain of delay elements, coupled to the capture register circuit, configured to receive the source clock to generate the second clock, wherein a second number of the second chain of delay elements is adjustable to provide the second clock to the capture register circuit;
   a control circuit, coupled to the delay determination circuit, configured to adjust the first number of the first chain of delay elements and the second number of the second chain of delay elements for the capture register circuit to just capture the test data, and determine a path delay between the launch register circuit and the capture register circuit based on the first number of the first chain of delay elements and the second number of the second chain of delay elements; and
   a plurality of the delay monitoring cells arranged in a matrix;
   wherein each delay monitoring cell is connected to adjacent delay monitoring cells and comprises the delay determination circuit;
   the plurality of the delay monitoring cells are configurable to form a route from a first delay monitoring cell to a second delay monitoring cell in the plurality of the delay monitoring cells; and
   the control circuit is configured to adjust the first numbers of the first chain of delay elements and the second numbers of the second chain of delay elements of the delay monitoring cells in the route to determine a route path delay between the launch register circuit in the first delay monitoring cell and the capture register circuit in the second delay monitoring cell.

2. The integrated circuit of claim 1, further comprising:
   a calibration circuit, coupled to the plurality of the delay monitoring cells, configured to calibrate the first chain of delay elements and the second chain of delay elements in the plurality of delay monitoring cells.

3. The integrated circuit of claim 1, wherein each delay monitoring cell further comprises two or more multiplexers; and
   the control circuit is configured to set the two or more multiplexers in the plurality of delay monitoring cells to form the route from a first delay monitoring cell to a second delay monitoring cell in the plurality of the delay monitoring cells.

4. The integrated circuit of claim 1, wherein the launch register circuit comprises a counter, configured to generate the test data; and
   the capture register circuit comprises a comparator, configured to compare the test data to reference data.

5. The integrated circuit of claim 1, wherein the control circuit is configured to output the delay monitoring cells in the route and the route path delay to perform correlations for a cell delay of the delay monitoring cell and a wire delay of wire connection between the delay monitoring cells.

6. A method of providing an on-chip variation determination to an integrated circuit, comprising:
   outputting, by a launch register circuit, a test data to the capture register circuit according to the first clock;
   receiving, by a capture register circuit, the test data from the launch register circuit according to the second clock;
   adjusting, by a control circuit, a first number of a first chain of delay elements and a second number of a second chain of delay elements for the capture register circuit to just capture the test data; wherein the first number of the first chain of delay elements is configured to receive a source clock to generate the first clock, and the second number of the second chain of delay elements is configured to receive the source clock to generate the second clock; and
   determining, by the control circuit, a path delay between the launch register circuit and the capture register circuit based on the first number of the first chain of delay elements and the second number of the second chain of delay elements;
   wherein a plurality of the delay monitoring cells are arranged in a matrix, and each delay monitoring cell is connected to adjacent delay monitoring cells and comprises the delay determination circuit;
   the method further comprises: configuring, by the control circuit, a route from a first delay monitoring cell to a second delay monitoring cell in the plurality of the delay monitoring cells;
   the step of adjusting the first number of the first chain of delay elements and the second number of the second chain of delay elements comprises: adjusting, by the control circuit, the first number of the first chain of delay elements in the first delay monitoring cell and the second number of the second chain of delay elements in the second delay monitoring cell for the capture register circuit in the second delay monitoring cell to just capture the test data; and
   the step of determining the path delay comprises: determining, by the control circuit, a route path delay between the launch register circuit in the first delay monitoring cell and the capture register circuit in the second delay monitoring cell.

7. The method of claim 6, further comprising:
correlating the determined path delay to a reference path delay to determine a cell delay of the delay monitoring cell and a wire delay of wire connection between the delay monitoring cells;
wherein the reference path delay is computed in a static timing analysis procedure for a path between the launch register circuit and the capture register circuit.

8. The method of claim 6, further comprising:
calibrating, by a calibration circuit, a delay length of the first chain of delay elements and the second chain of delay elements in the plurality of delay monitoring cells.

9. The method of claim 6, wherein each delay monitoring cell further comprises two or more multiplexers; and
the method further comprises: setting, by the control circuit, the two or more multiplexers in the plurality of delay monitoring cells to form the route from a first delay monitoring cell to a second delay monitoring cell in the plurality of the delay monitoring cells.

10. The method of claim 6, wherein the launch register circuit comprises a counter, configured to generate a test data; and the capture register circuit comprises a comparator, configured to compare the test data to a reference signal.

* * * * *